(12) United States Patent
Allen, III et al.

(10) Patent No.: US 7,003,421 B1
(45) Date of Patent: Feb. 21, 2006

(54) VDD OVER AND UNDERVOLTAGE MEASUREMENT TECHNIQUES USING MONITOR CELLS

(75) Inventors: Ernest Allen, III, Hillsboro, OR (US); David Castaneda, Clackamas, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/700,790

(22) Filed: Nov. 3, 2003

(51) Int. Cl.
*G01R 31/00* (2006.01)
*G01R 31/14* (2006.01)

(52) U.S. Cl. .................................. 702/117
(58) Field of Classification Search ............... 702/57, 702/60, 63–65, 107, 117–121; 327/3, 7, 327/56, 57; 324/73.1, 76.11, 76.39, 763, 324/765

See application file for complete search history.

(56) References Cited

U.S. PATENT DOCUMENTS

| | | | | |
|---|---|---|---|---|
| 4,020,366 A | * | 4/1977 | Garner et al. | 327/114 |
| 4,156,280 A | * | 5/1979 | Griess | 702/58 |
| 4,713,819 A | * | 12/1987 | Yoshikawa | 372/9 |
| 4,797,608 A | * | 1/1989 | White | 324/96 |
| 6,118,293 A | * | 9/2000 | Manhaeve et al. | 324/765 |
| 6,211,623 B1 | * | 4/2001 | Wilhelm et al. | 315/224 |
| 6,348,806 B1 | * | 2/2002 | Okandan et al. | 324/763 |
| 6,373,326 B1 | * | 4/2002 | Tomari | 327/536 |
| 6,437,308 B1 | * | 8/2002 | Koh | 250/214 R |
| 2004/0225333 A1 | * | 11/2004 | Greatbatch et al. | 607/34 |

* cited by examiner

*Primary Examiner*—Michael Nghiem
(74) *Attorney, Agent, or Firm*—Beyer Weaver & Thomas, LLP

(57) ABSTRACT

According to one embodiment, a method of testing an integrated circuit is provided. A reference voltage is coupled to each of a first and second comparator integrated on the chip. A supply voltage is compared to the reference voltage in a comparator to determine overvoltage or undervoltage conditions. The results of the comparison are stored and sizing and placing of at least one decoupling circuit in the circuit design is made based on the stored determinations.

20 Claims, 3 Drawing Sheets

VDD OVER AND UNDERVOLTAGE MEASUREMENT TECHNIQUES USING MONITOR CELLS

BACKGROUND OF THE INVENTION

1. Field of the Invention

The present invention relates to processes involved in the manufacturing and testing of semiconductor devices. More particularly, the present invention relates to methods for detecting voltage spikes during testing of integrated circuits.

2. Description of the Related Art

As integrated circuit devices grow smaller and smaller, the testing of the integrated circuits presents greater challenges. For example, the shrinkage of transistor sizes to the point that critical dimensions are well below one micron ($10^{-6}$ m), has compelled designers to reduce operating voltages to maintain device reliability. And while designers enjoy a significant improvement in device speeds due to the smaller geometries employed, it has not been possible to reduce power consumption in direct relation to those critical dimensions. As a result, device currents have tended to increase, which has forced designers to employ ever-greater amounts of ingenuity to the problem of distributing the total current available to the designed devices.

Unfortunately, this trend has resulted in electronic circuits becoming much more susceptible to power supply transient spikes (i.e., overvoltage conditions) which not only interfere with the proper function of latches and other devices, but can also deprive sufficient current to other areas of the circuit that are remote from the portion causing the spike (i.e., undervoltage or voltage droop conditions).

It is also important to distinguish between design-related problems and manufacturing-related problems. Manufacturing related problems relate primarily to quality issues and are the focus of specialized testing methods such as determined by automated testing techniques. In a traditional automated test equipment (ATE) environment, power and ground connections are required to be connected to the die under test but are inferior to those in the final application. This is a consequence of the need for quick-release capability in the test site coupled with the great physical distance between the device under test and the power supply that provides its power. The power supply voltage is commonly designated as $V_{DD}$ and may vary as it is distributed throughout the circuit, in part based on the demands placed on that particular part of the circuit.

The configuration of the testing environment typically increases this variation. In the testing environment, the soldering and desoldering of power, signal, and ground connections is not feasible because of the impact on testing throughput. Thus, these unique testing conditions may result in the manifestation of undervoltage or overvoltage measurements that are not reliably predictive of similar results in field operation of the circuit. That is, there may be a decrease in supplied voltage, i.e., $V_{DD}$ droop situations, that occur during testing that would never occur in the final application.

The traditional solution to this problem in manufacturing has been to change the decoupling on the device. That is, decoupling capacitors are used to buffer the voltages, sinking current during a positive voltage spike and supplying current during a negative voltage spike. But implementing decoupling changes that will satisfactorily address the varying current demands is difficult, and there are often very severe limits to the total bulk capacitance that can be added to a circuit before operation of the circuit is adversely affected. For example, sense lines for the power supply may enter into an oscillatory mode from excessive decoupling added to a circuit.

What is needed in this case, therefore, is a tool that can be easily used in manufacturing, and which will allow the manufacturing test engineers to pinpoint the precise locations where better decoupling is needed, and the locations where the designed decoupling should be placed for best effect. Specifically, it would be advantageous to provide a method for incrementally changing decoupling and then evaluating the consequences of that change in detail. This will greatly reduce the number of false starts in trying to reduce noise in the design and will allow the manufacturing support engineers to minimize the total decoupling that is used on the design. Since total decoupling always has a marginal effect on test speed (from power-on speed on settling time after voltage changes), such a minimization would provide direct cost benefits in manufacturing as well.

A second area where $V_{DD}$ droop problems occur is the design itself. Even in cases where the ATE test environment is fairly close to ideal, the power routing within the integrated circuit itself may prevent proper operation of the circuit under all field conditions. For example, in some cases the design shows no problems in simulations but does so in field operation. These situations often require the expensive and time-consuming steps of micro-probing the circuit to identify the regions prone to $V_{DD}$ drop or current starvation. Even after undertaking these measures, the results are still prone to error.

Thus, a non-invasive method of testing the $V_{DD}$ levels inside a device at some arbitrary point in time during testing as well as field operations of the circuit would be extremely useful. These methods should permit determination of over and undervoltages accurately under various conditions.

SUMMARY OF THE INVENTION

To achieve the foregoing, the present invention provides methods for detecting voltage spikes in integrated circuits using at least one monitor cell integrated in the die. Preferably the monitor cell comprises a digital comparator for comparing a voltage level of the integrated circuit to a voltage reference level. Preferably, the reference level is provided by the Automated Test Equipment. A latch is coupled to the output of the digital comparator to store any occurrences of the internal voltage exceeding the reference voltage for over voltage detection or internal voltages falling below a reference voltage level for undervoltage detection. In one embodiment, both overvoltage and undervoltage detection is detected simultaneously by using a pair of comparators connected to the supply voltage.

By incorporating one or more monitor cells into the integrated circuit, reliable information may be provided as to the extent of the over or under voltage condition and the locations of such voltage drops may be most precisely determined. Thus, discrepancies between on-tester results and field results may be minimized.

According to one embodiment, a method of testing an integrated circuit is provided. A first reference voltage is applied to a first input of a first monitor cell on the chip. Each of the monitor cells comprises a comparator and a latch coupled to the output of the comparator. A first test voltage from a selected portion of the chip is applied to a second input of the first monitor cell. The first reference voltage is compared to the first test voltage using the comparator and a first result is stored in the latch of the first monitor cell. A second reference voltage having a value different from the first reference voltage is applied to the first input of the first monitor cell. The second reference voltage is compared to the first voltage using the comparator and a second result is provided in the latch of the first monitor cell. The first and second results are then analyzed to determine a value for the first test voltage reference.

These and other features and advantages of the present invention are described below with reference to the drawings.

DETAILED DESCRIPTION OF PREFERRED EMBODIMENTS

Figure 1:
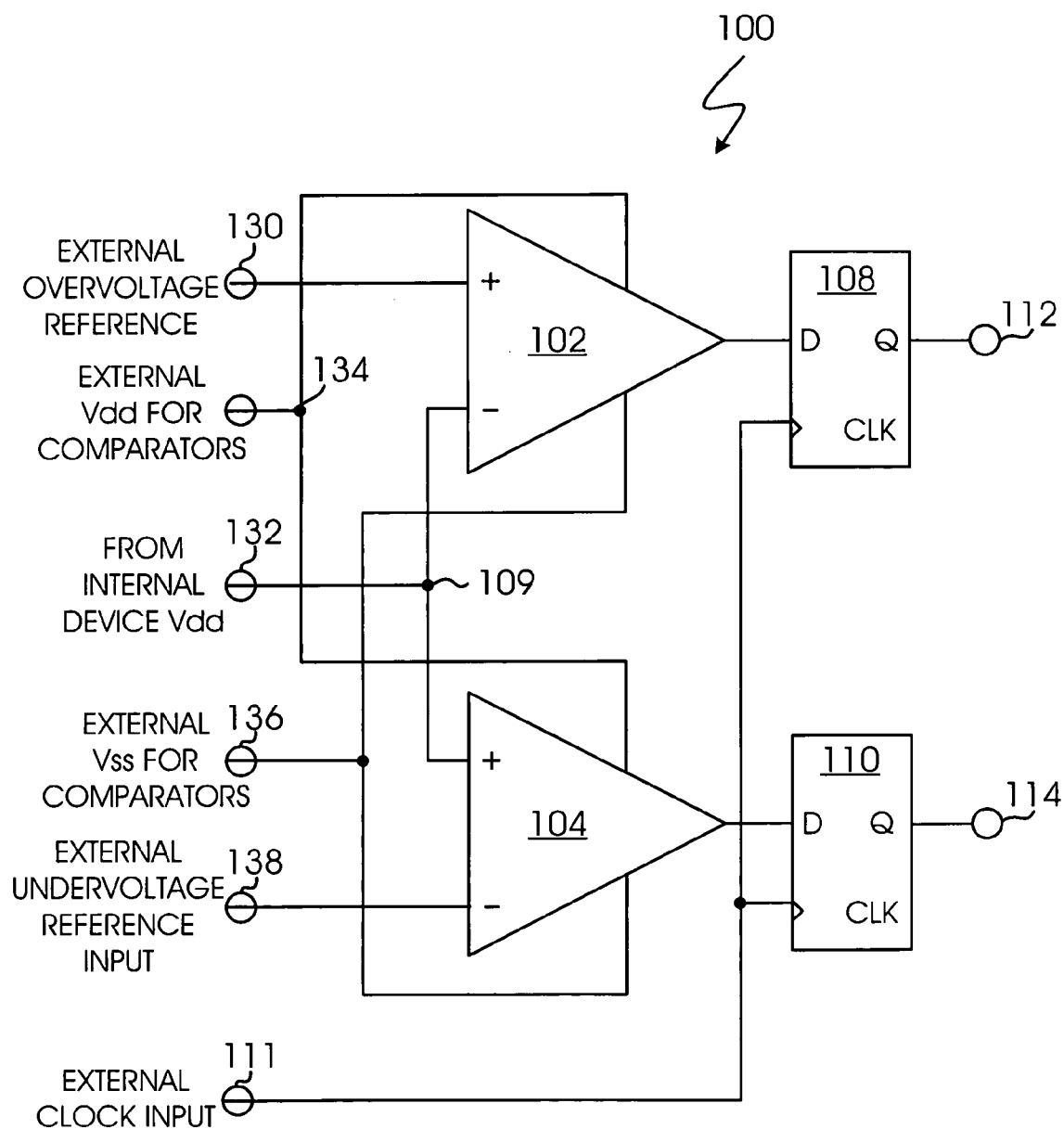
FIG. 1 is a diagram illustrating a voltage monitor cell in accordance with one embodiment of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternative, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The manufacturing of semiconductor chips requires functionality testing to verify their basic method of operation as well as testing to determine freedom from faults that might result from quality differences in the manufacture of the chips. For example, a scan vector test is designed to determine manufacturing defects within a circuit. Scan logic typically transmits data in and out of a device using dedicated test input/output pins. After the tests are completed, the electronic devices under test transmit data from output pins for recording and further processing to evaluate the test results. Commonly, these scan chains are directed to the device under test by automated test equipment (ATE), with the results processed by the same equipment. The present invention, in one embodiment, is intended to be used with ATE testing programs and scan chains.

During testing, as sudden demands for current increases, power supplies may be unable to meet the instantaneous demand. As a result, the supply voltage present may drop significantly and cause abnormal test results. Alternatively, an increase in the voltage supplied, i.e., a voltage spike, may cause unwanted current to flow to the circuit under test. One conventional method for preventing these voltage spikes and voltage droops, i.e., sudden changes in supply voltage, is to configure the circuit to include decoupling circuitry. This typically includes capacitors to buffer the voltages supplied.

These additional sources of voltage help regulate the power supplied to the circuit under test, both in overvoltage and under voltage situations. That is, when the voltage drops below a predetermined level, the decoupling circuitry supplies additional current to meet the demand. When the positive voltage spike occurs, the decoupling circuitry may absorb additional current. In other words, the decoupling circuitry sinks current during positive voltage spikes and sources current during negative voltage spikes.

Decoupling circuitry is often included in circuit design to accommodate these voltage and current fluctuations both during testing and in field use. As can be appreciated, the size and location of the decoupling circuitry is critical to ensure that the variations in current demand are met. For example, larger decoupling circuitry is required for larger rates of changes in supply current. Decoupling circuitry of a specified size may be sufficient to handle the source and sink current requirements if located adjacent to the portion of the circuitry producing the voltage spike or demanding the increase in current but prove to be insufficient if location in a remote portion of the chip. This results, in part, from inductance present in the circuitry. Thus, an ability to optimize the size and location of decoupling circuitry would be beneficial to circuit designers.

The method outlined in this specification preferably includes, on every integrated circuit that is manufactured, at least once instance of a voltage spike detection or monitor cell consisting of a digital comparator, a latch to store any occurrences of an overvoltage or undervoltage situation, and a reference input, driven by the ATE, against which the supply voltage on the device is to be compared. If both overvoltage and undervoltage detection is desired, then two comparators are preferably used to monitor a single point in a circuit, although the scope of the invention is intended to also extend to implementations where one comparator is used, such as, for example, where sequential switching is used to change the coupling of the reference voltage and supply voltage from one comparator terminal to the other.

FIG. 1 is a diagram illustrating a voltage monitor cell integrated in a die (i.e., an integrated circuit, in accordance with one embodiment of the present invention. One or more voltage monitors cells 100 is preferably included on each device (die) manufactured to identify positive and negative voltage spikes and to assist in sizing and locating decoupling circuitry. The monitor cell 100 preferably includes a digital voltage comparator 102, a latch 108 to store occurrences of over and under voltage conditions, and a reference voltage input (such as 130) driven by automated test equipment (ATE). The reference voltage provided to the comparator 102 is used as a standard for determination as to whether an overvoltage has occurred. The term overvoltage refers to a measured voltage in the circuit that exceeds the tolerances provided for the nominal designed voltage for that circuit. For example, a circuit may be designed for 1.3 volts with a tolerance of ±0.09 volts. In that case, an overvoltage would be any voltage of 1.40 volts or higher. Conversely, an under voltage would be 1.20 volts or lower. Thus, the supply voltage is compared against either or both of an external overvoltage reference and an external undervoltage reference.

Voltage comparators are well known to those skilled in the relevant art. Voltage comparators typically include an operational amplifier with transistors coupled to the output of each operation amplifier. The output is switched to ON or OFF depending on the relative voltages at the positive and negative inputs of the comparator. For example, if the voltage at the positive terminal of the comparator is less than the voltage at the negative terminal, current will flow at the output, i.e., a "1" is generated to the digital latch as shown in FIG. 1. Thus, for overvoltage detection, the reference voltage is connected to the positive terminal and the supply voltage is connected to the negative terminal of the comparator. Conversely, for undervoltage detection, the reference voltage is connected to the negative input terminal of the comparator and the supply voltage tested is connected to the positive input terminal.

The voltage monitor cell 100 preferably includes a second digital voltage comparator 104 when both over voltage and under voltage conditions are to be monitored. The second digital voltage comparator preferably uses the same internal device $V_{DD}$ 132 as the first voltage comparator when both readings (i.e., overvoltage and undervoltage) are desired for a specified circuit location. However, the invention is not so limited. In this embodiment, an external undervoltage reference input 138 is connected to the negative input of the second comparator 104. Monitor cells configured for undervoltage measurement only may be distributed throughout the integrated circuit and used in conjunction with monitor cells configured for overvoltage measurement only as well as dual configured monitor cells (i.e., configured for both overvoltage and undervoltage measurements). Voltage comparators 102 and 104 include preferably operational amplifiers and are provided with an external supply voltage ($V_{DD}$) for operation of the operational amplifiers included in the comparators 102 and 104. Suitable operational amplifiers for use in digital voltage comparators are known to those of skill in the art and are readily available commercially from a variety of vendors. Therefore, further description is deemed unnecessary here.

As shown, the voltage comparator 102 is configured to compare an external overvoltage reference voltage 130 to the voltage supply level $V_{DD}$ (132) present at the device. The same voltage supply level $V_{DD}$ (132) is fed to the second comparator 104 for undervoltage direction. That is, to test for both overvoltage and undervoltage conditions with the circuit of the invention, the negative input terminal of the first comparator 102 may be directly connected to the positive input terminal of the second comparator, and the supply voltage under test ($V_{DD}$) 132 may be connected to this common terminal 109, as illustrated in FIG. 1.

In the circuit illustrated, a second latch 110 with a clocked input CLK is included to record instances of undervoltage. In order to pinpoint the time of occurrence of detected defects, latches 108 and 110 each having a clocked input CLK signal, driven by external clock input 111. The detected output may be recorded for a variety of input test conditions. For example, a pattern of test signals may be applied to the input/output pads of the integrated circuit and an evaluation made as to the conditions giving rise to the detected faults.

For example, during an application instance of the test pattern, the Q outputs (112 and 114 respectively) of the latches 108 and 110 are preferably examined to see whether an overvoltage or undervoltage event occurred. The reference input can be varied as well to allow measurement of the size of that event. For example, if the minimum $V_{DD}$ reached by the $V_{DD}$ input supply voltage 132 is 1.2 volts, then varying the reference voltage during repeated executions of the test pattern enables determination of the value of the supply voltage $V_{DD}$ 132 to the limits of the precision of the tester. If the undervoltage reference is set to 1.19 volts, for example, the comparator will not trigger, and the Q output 112 of the latch 108 will be '0'. But if the undervoltage reference is set to 1.21 volts, then the latch 108 will show a '1' on the Q output 112 after the pattern is executed. Using this technique, the repeated executions allow an accurate value to be determined for the undervoltage and similarly for the overvoltage. Using the reference voltages available from ATE equipment, the adjustments in reference voltages can be easily and quickly made to increase the throughput of the testing process.

Commercially available comparators are quite sensitive to differences in voltages at the inputs. The sensitivity of the comparators will be chosen based on the circuit requirements. Preferably, the sensitivity of the comparator will be such that a predetermined voltage difference will cause the output to turn on or off. The comparison voltage can be set to the predetermined value, and is typically done by using resistors.

With this configuration, the locations of overvoltage or undervoltage conditions in voltage supply lines of the integrated circuit under test may be determined. Moreover, by incorporating additional monitor cell circuits in the integrated circuit die, evaluation of the results for the plurality of voltage monitor cell circuits during one or more executions of the test pattern can enable the identification of optimal locations and sizes for decoupling circuitry. The placement of the monitor cells is preferably determined by evaluation of several factors. For example, mature technologies with low defeat densities may require fewer monitor cells. The number and placement of cells may also depend on design sensitivities to the given process. The number and placement of the monitor cells may be tailored based on experience. Thus, the scope of the invention is not intended to be limited to a particular configuration.

This technique may be used to position decoupling on a temporary basis customized for the testing configuration or alternatively to modify the circuit design so that adequate decoupling exists to meet the operational environment of the circuit during field operations.

It is also necessary to provide an independent supply voltage and ground (i.e., $V_{DD-C}$ 134 and $V_{SS-C}$ 136) for the comparison themselves, the independent supply voltage 134 for the comparators 102 and 104 having a higher value than either the reference voltage 130 or the supply voltage 109 of the integrated circuit tested. Modern integrated circuit designs often use multiple voltage levels present at the I/O pads of the IC. Preferably, one of the I/O supply levels are tapped to run the comparators, since droops and spikes in the core $V_{DD}$ are usually the only ones of major concern. Alternatively, for the rare designs that operate on only a single supply level, these voltages may be supplied externally from the ATE.

One major advantage conferred by using this circuit in an ATE environment is that the ATE pin electronics can be used to vary both the overvoltage and undervoltage reference inputs to this circuit, so that, for example, the undervoltage reference stays at 0 volts, except for a brief point of time when it rises to 1.2 volts. This allows, for example, identification of the undervoltage event by attaching a time stamp which will enable plotting of the variation of $V_{DD}$ voltage during the execution of one or more complete test patterns. The ability this gives to the test engineer, i.e., to be able to feed back to the designer the exact point in time when the overvoltage or undervoltage even takes place, represents a significant advance over current debugging techniques.

Preferably, in a specific embodiment of the integrated circuit design, the voltage detectors are placed at many different points in the layout. With this configuration, the latches that are intended to capture the overvoltage or undervoltage conditions are preferably ties into the scan chains that are a normal part of modern 'design for testability' techniques. The clock signals (CLK) included in FIG. 1 above are then the normal scan clock signals for the scan chain that includes the latches 102 and 104 shown there.

Figure 2:
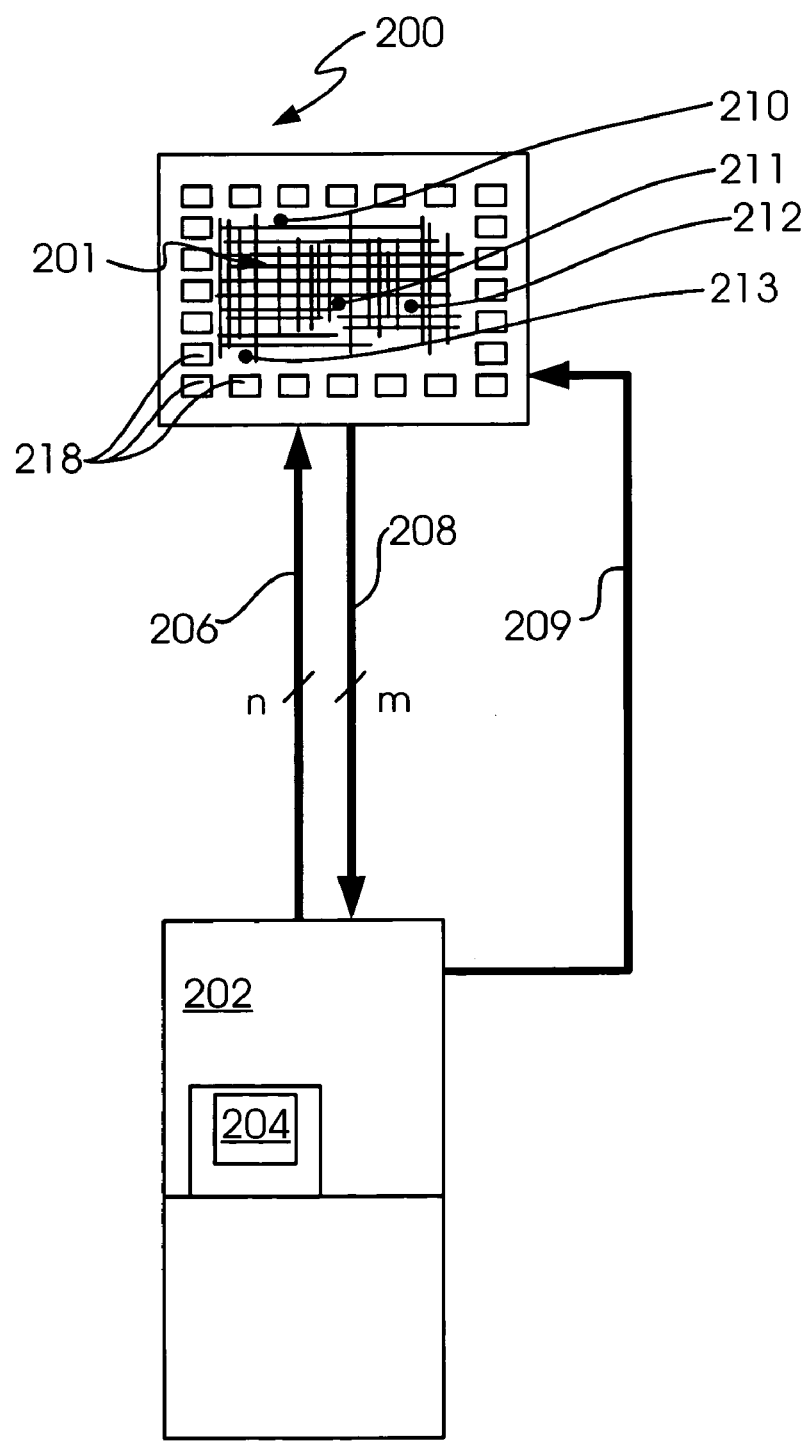
FIG. 2 is a diagram illustrating Automated Test Equipment and integrated circuit configuration for detecting voltage spikes in accordance with one embodiment of the present invention.

FIG. 2 is a diagram illustrating Automated Test Equipment and an integrated circuit configured for detecting voltage spikes in accordance with one embodiment of the present invention. As illustrated, an integrated circuit 200 is configured with a plurality of monitor cells 210, 211, 212, and 213 to detect supply voltage variations throughout the integrated circuit 200. Preferably, the monitor cells 210–213 are positioned at various locations in the integrated circuit to provide an accurate representation of the variations in supply voltage $V_{DD}$ in the circuit as caused by varying current demands in the integrated circuit 200. For example, the monitor cells according to one embodiment are placed in a rectangular grid configuration, the measured values for overvoltage and/or undervoltage obtained according to the process further described and illustrated in FIG. 3, used to determine an optimal location for decoupling capacitors. For example, if overvoltage measurements show a maximum voltage at monitor cells 211 and 212 of 1.48 volts, as compared to overvoltage measurements of 1.40 volts at monitor cells 210 and 213, then this data would suggest an optimized location for a decoupling circuit to be between monitor cells 211 and 212. The identification of 4 monitor cells is intended to be illustrative and not limiting. Thus, the scope of the present invention is intended to extend to as few as one cell to an unlimited number of monitor cells, the number being limited only by the available space on the die. Moreover, the configuration of the monitor cells may, without limitation, fall within available die space and follow a random pattern, a uniform pattern, or a pattern customized for the integrated circuit. For example, known or expected problematic areas on the die may receive a higher concentration of monitor cells then other areas of the die.

Preferably the monitor cells 210–213 are integrated within the die and electrically connected to one or more of the I/O pads 218 located on the die 200 for connection to the ATE tester 202. ATE testers are known to those of skill in the art and thus further description here is deemed unnecessary. The AT 202 may include a monitor 204 or other display screen to monitor the application of a test vector or the results of the testing. In one embodiment, the test vector is applied along a bus of "n" bits to selected I/O pads 218 on the die 200. Results are transmitted to the ATE 202 via another bus 208. Separate power and ground lines may be provided from the ATE 202 to the die 200, such as along lines 209.

Figure 3:
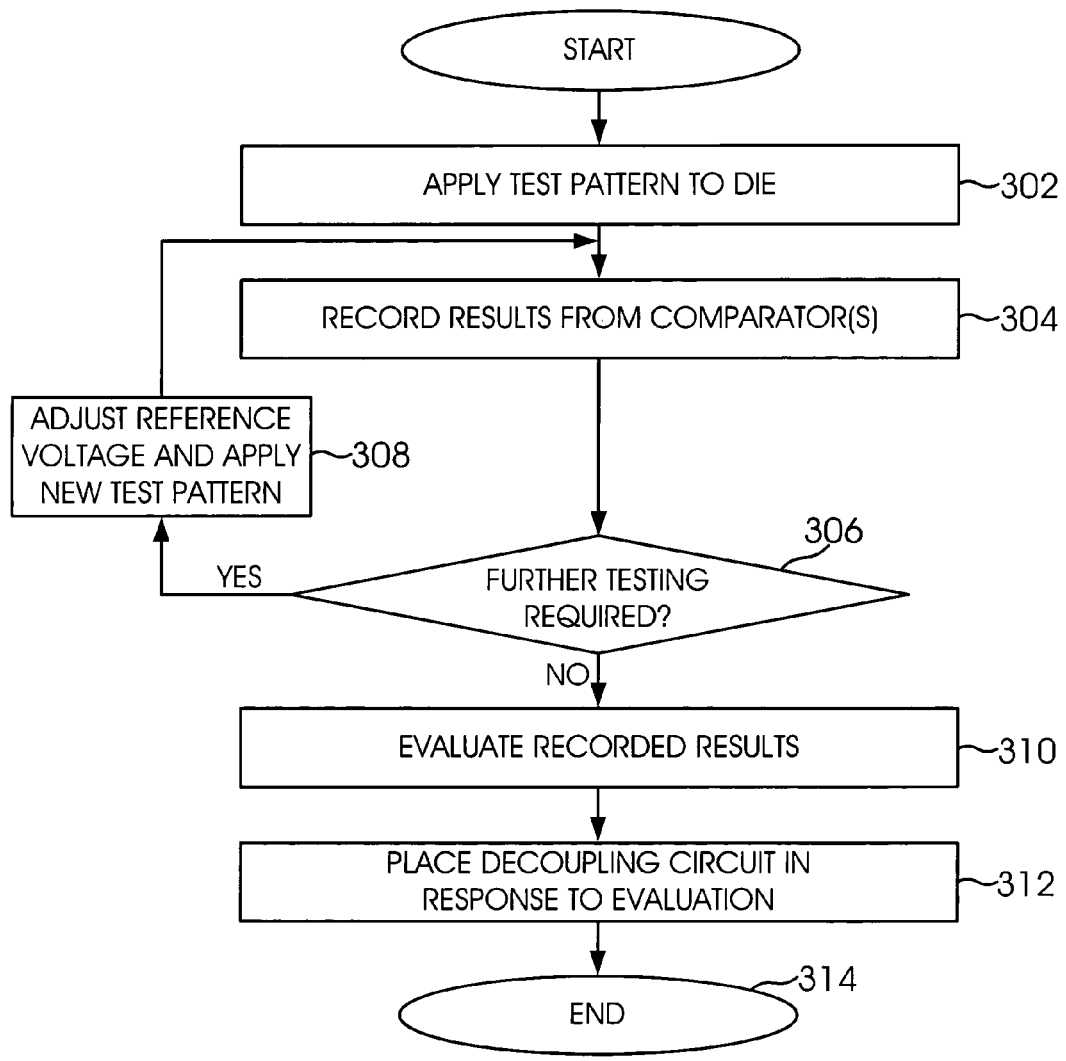
FIG. 3 is a flowchart illustrating a method of testing a circuit to identify a location for decoupling in accordance with one embodiment of the present invention.

FIG. 3 is a flowchart illustrating a method of testing a circuit to identify a location for decoupling in accordance with one embodiment of the present invention. Once the process begins, a test pattern is applied to the die at an operation 302. Preferably the test pattern is applied by the ATE in accordance with design for testability procedures, such procedures as known to those of skill in the relevant art. The initial test pattern will preferably incorporated at least one reference voltage for determining at least one of an overvoltage or undervoltage condition at one or more $V_{DD}$ supply locations in the integrated circuit under test. Next, at an operation 304, the results from the comparators integrated into the integrated circuit are compared. That is, the digital results recorded in the latches (e.g., latch 108 or 110) for each of the comparators are recorded. The outputs of the latches (e.g., Q output 112 or 114) for example, may be coupled to the I/O pads of the integrated circuit for coupling and recording by the ATE.

Next, at an operation 306, a determination is made as to whether further testing is required. Preferably this determination is made by an ATE configured to generate test patterns, record results, and vary one or more input reference voltages. Preferably, application of a reference voltage and evaluation of the recorded result in one or more latches will in several iterations, the reference voltage varied for each iteration in order to identify with some precision the values of the overvoltage or undervoltage. That is, if further testing is required, i.e., further iterations of varying the reference voltages, the procedure advances to operation 308 where a new test pattern is applied. Preferably, the test pattern will comprise the same parameters of the original test pattern, modified by the application of new reference voltages.

The new test pattern and reference voltages are then applied to the die and results recorded again in operation 304. When a sufficient number of test iterations have been completed to identify the values of the overvoltage and/or the undervoltage, control of the process passes from operation 306 to operation 310. That is, in an operation 310, the recorded results, preferably recorded at the ATE equipment, are evaluated to identify the levels of overvoltage or undervoltage. Using this information, a determination can be made as to the location and sizing of decoupling circuits in operation 312. The process ends at a step 314.

The techniques of the present invention provide the capability of determining the variations of supply voltage at a plurality of places in a chip during ATE testing. This allows greater precision to manufacturing engineers in identifying decoupling needs in a test configuration. Moreover, these techniques can be applied to identifying voltage droop problems in the design itself and to pinpoint the locations of the $V_{DD}$ droops or current starvation in a non-invasive manner Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for testing an integrated circuit chip comprising:
    a) applying a first reference voltage to a first input of a first monitor cell of at least one monitor cell integrated on the chip, wherein each of the monitor cells comprises a comparator and a latch coupled to the output of the comparator;
    b) applying a first test voltage from a selected portion of the chip to a second input of the first monitor cell;
    c) comparing the first reference voltage to the first test voltage using the comparator for providing a first result for storage in the latch of the first monitor cell;
    d) applying a second reference voltage having a value different from the first reference voltage to the first input of the first monitor cell;
    e) comparing the second reference voltage to the first test voltage using the comparator for providing a second result in the latch of the first monitor cell; and
    f) analyzing the first and second results to determine a value for the first test voltage.

2. The method as recited in claim 1 further comprising adding a decoupling circuit to a selected portion of the chip based on the first and second results and repeating steps a) through f) after adding the decoupling circuit.

3. The method as recited in claim 1 further comprising applying sequentially the first reference voltage and the second reference voltage to a first input of a second of the at least one monitor cells and applying a second test voltage from a second selected portion of the chip to a second input of the second monitor cell.

4. The method as recited in claim 3 further comprising:
comparing the first reference voltage to the second test voltage using the comparator for providing a first result for storage in the latch of the second monitor cell;
comparing the second reference voltage to the second test voltage using the comparator for providing a second result in the latch of the second monitor cell; and
analyzing the first ands second results of the second monitor cell to determine a value for the second test voltage.

5. The method as recited in claim 4 further comprising analyzing the values determined for the first and second test voltages to determine a size and location for decoupling circuitry to be coupled to the chip.

6. The method as recited in claim 3 wherein the first and second test voltages are power supply voltages taken at different locations on the chip.

7. The method as recited in claim 1 wherein the second reference voltage is obtained by adjusting the first reference voltage to a new level.

8. The method as recited in claim 1 wherein testing is performed using automated test equipment and the first and second reference voltages are supplied by the ATE.

9. The method as recited in claim 1 wherein the testing is performed during the application of a scan chain to the chip.

10. The method as recited in claim 5 wherein the chip is a prototype chip and the decoupling circuitry is added to the design of the chip.

11. The method as recited in claim 1 wherein comparing the first reference voltage to the first test voltage and comparing the second reference voltage to the first test voltage comparison making a determination as to at least one of whether the first test voltage is less than the reference voltage when testing for undervoltage conditions or whether the first test voltage exceeds the reference voltage when testing for overvoltage conditions.

12. The method as recited in claim 1 wherein the comparing comprises making a determination as to whether the first reference voltage and the second reference voltage exceeds the first test voltage when testing for overvoltage conditions.

13. The method as recited in claim 1 wherein the comparing comprises making a determination as to whether the first reference voltage or the second reference voltage is less than the first test voltage when testing for undervoltage conditions.

14. A method of testing an integrated circuit comprising:
a) providing an overvoltage reference voltage and supply voltage to a first voltage comparator;
b) providing an undervoltage reference voltage and the supply voltage to a second digital comparator;
c) making a first determination for the first voltage comparator whether the overvoltage reference voltage exceeds the supply voltage;
d) making a second determination for the second comparator whether the supply voltage exceeds the undervoltage reference voltage; and
e) storing the first and second determinations in a first and a second latch attached respectively to the first and second comparators.

15. The method as recited in claim 14 further comprising adjusting the overvoltage reference voltage and the undervoltage reference voltage and repeating steps c) through e) and determining the value for the supply voltage from the stored results.

16. The method as recited in claim 15 further comprising duplicating each of the steps recited for claim 15 for a plurality of locations across the integrated circuit, each of the locations potentially having a different supply voltage than other of the locations.

17. The method as recited in claim 16 further comprising analyzing the values determined for the supply voltage to determine a size and location for adding decoupling circuitry.

18. An integrated circuit adapted for voltage level detection, the integrated circuit comprising:
a plurality of voltage supply conductors configured for providing a power supply voltage to the integrated circuit; and
a monitor cell integrated in the integrated circuit for testing over and under voltage conditions, the monitor cell comprising a first digital voltage comparator and a second digital voltage comparator each of the comparators coupled respectively to an associated latch for receiving the output of the voltage comparator, wherein:
inputs to the first comparator comprise a supply voltage from one of the plurality of supply conductors and an overvoltage reference voltage;
inputs to the second comparator comprise the supply voltage from the one of the plurality of supply conductors and an undervoltage reference voltage; and
wherein the monitor cell is further configured to receive at an input of the first comparator and at an input of the second comparator a reference voltage provided by one of the plurality of voltage supply conductors for comparison with the supply voltage.

19. An integrated circuit adapted for voltage level detection, the integrated circuit comprising:
a plurality of voltage supply conductors configured for providing a power supply voltage to the integrated circuit; and
a monitor cell integrated in the integrated circuit for testing over and under voltage conditions, the monitor cell comprising a first digital voltage comparator and a second digital voltage comparator each of the comparators coupled respectively to an associated latch for receiving the output of the voltage comparator, wherein:
inputs to the first comparator comprise a supply voltage from one of the plurality of supply conductors and an overvoltage reference voltage;
inputs to the second comparator comprise the supply voltage from the one of the plurality of supply conductors and an undervoltage reference voltage; and
wherein the monitor cell is configured to receive a reference voltage from automated test equipment and to transmit outputs of the associated latches to the automated test equipment.

20. An integrated circuit adapted for voltage level detection, the integrated circuit comprising:
a plurality of voltage supply conductors configured for providing a power supply voltage to the integrated circuit; and a monitor cell integrated in the integrated circuit for testing over and under voltage conditions, the monitor cell comprising a first digital voltage comparator and a second digital voltage comparator each of the comparators coupled respectively to an associated latch for receiving the output of the voltage comparator, wherein the latches of monitor cell each include a timer configured to timestamp occurrences of overvoltage incidents and undervoltage incidents and wherein:

inputs to the first comparator comprise a supply voltage from one of the plurality of supply conductors and an overvoltage reference voltage; and inputs to the second comparator comprise the supply voltage from the one of the plurality of supply conductors and an undervoltage reference voltage.

* * * * *